United States Patent [19] [11] Patent Number: 4,895,005
Norbeck et al. [45] Date of Patent: Jan. 23, 1990

[54] MOTOR TERMINAL BOX MOUNTED SOLID STATE STARTER

[75] Inventors: Dean K. Norbeck, York; Harold R. Schnetzka, II, Spring Grove, both of Pa.

[73] Assignee: York International Corporation, York, Pa.

[21] Appl. No.: 291,779

[22] Filed: Dec. 29, 1988

[51] Int. Cl.$^4$ .............................................. H02B 1/00
[52] U.S. Cl. ...................................... 62/506; 174/15.1; 310/54; 361/385
[58] Field of Search ........................... 62/506; 310/54; 174/15.1; 361/379, 385, 388

[56] References Cited

U.S. PATENT DOCUMENTS 3,405,323 10/1968 Surty et al. ...................... 361/385 X
4,084,406 4/1978 Brenneman ........................... 62/211
4,317,952 3/1982 Armor et al. ....................... 310/54 X
4,475,152 10/1984 Ikegame et al. ................. 361/379 X

OTHER PUBLICATIONS

Descriptive Literature for the York Current-Guard TM Solid-State Starter, dated 5/1976.

Primary Examiner—William E. Wayner
Attorney, Agent, or Firm—Finnegan, Henderson, Farabow, Garrett & Dunner

[57] ABSTRACT

A power regulation system for an AC motor includes a motor terminal box mounted solid state starter having water-cooled SCRs. The SCRs of the starter are cooled by water circulated through a dedicated SCR heat exchanger. The starter mounted in the motor terminal box includes the SCRs configured as an AC switch and a gating circuit for generating gating signals for application to the SCRs.

28 Claims, 7 Drawing Sheets

MOTOR TERMINAL BOX MOUNTED SOLID STATE STARTER

The invention is directed in general to solid state starters for motors and, more specifically, to a compact water-cooled solid state starter which can be mounted in the motor terminal box.

BACKGROUND OF THE INVENTION

Solid state motor starters are known in the art and are applied to polyphase AC motors in order to provide, among other things, controlled motor current during motor starting. Solid state starters replace the use of conventional electromechanical starters that can provide either across-the-line starting or reduced voltage starting of the motor. While solid state motor starters provide improved control, they produce heat when operated.

Solid state starter comprise a plurality of three-terminal power semiconductor devices, e.g., silicon controlled rectifiers (SCRs), power transistors, gate turn-off devices (GTOs), etc., that are respectively driven into conduction by control signals applied to a control terminal of the device, e.g., the gate terminal of an SCR. In a manner well known in the art, by connecting the semiconductor devices in each AC source phase in series between the source and motor, e.g., as an AC switch, the devices can be selectively driven into conduction during motor starting to regulate the amount of starting current. Specifically, when configured as an AC switch, the semiconductor devices are controlled to conduct during only a portion of each cycle of the power source voltage such that a predetermined maximum current is not exceeded during motor starting. During motor steady state operation, the semiconductor devices are typically controlled to be fully conductive, i.e., resembling a closed switch.

A solid state starter is generally mounted close to its associated motor. For example, in a chiller system, various mechanical components, the motor, and the solid state starter, are mounted on a common structural base. Such systems are referred to hereinafter as skid mounted systems. However, even when the starter is mounted on a common base, the system still requires cabling and cable raceway for interconnecting the starter and motor.

During operation, power semiconductor devices generate heat which must be removed in order to maintain the devices within predetermined operating limits. Specifically, such devices are rated to carry current as a function of device junction cooling capacity so that it is necessary to maintain the junction temperature at or below a maximum value in order to carry a desired amount of current. Power semiconductor devices have been air-cooled or water-cooled. In the case of air-cooled devices, the assembled unit comprising the semiconductor device(s) and associated cooling fins can become physically quite large and therefore require a large physical mounting space. This is especially undesirable in skid mounted equipment where physical compactness of the overall system is usually preferable.

Assembled units comprising water-cooled power semiconductor devices are generally smaller than their air-cooled counterparts. An example of a commercially available water-cooled SCR unit is an open power module as manufactured by Powerex, Inc., of Youngwood, Pa., each such unit including two SCR devices. Use of such units enables allocation of a smaller physical space for their mounting. However, there are problems associated with such units. For example, in an industrial chiller system that provides equipment cooling water, the cooling requirements of the semiconductor devices represent an additional cooling load to the system, if they are cooled by the cooling water. A further disadvantage of utilizing such a primary cooling system is that the cooling water may be at a temperature below the dew point, thereby causing the formation of condensation on or near the semiconductor devices, with commensurate adverse effects on device dielectric strength. Moreover, the direct use of either the water of the chiller system condenser or other cooling system water for semiconductor device cooling can be undesirable because the water may not be sufficiently clean for passage through the cooling elements associated with each semiconductor device. Further, the pressure of the cooling water may be too high for semiconductor device cooling. In addition, commercially available water-cooled SCR units have not provided optimum cooling results during start-up operation when the SCR's produce greater amounts of heat over a short period.

In view of the above problems, others have tried to provide a motor starter which is compact and is liquid-cooled. For example, U.S. Pat. No. 4,084,406 to Brenneman discloses chilling equipment that includes a motor driven compressor and a solid state starter for driving the motor. The SCRs comprising the starter are mounted in a sealed starter box. The disclosed system requires that six electrical terminal studs connected to the SCRs protrude through a cover plate mounted on an outside face of the starter box, the cover plate serving as a cover for the motor terminal box upon being bolted thereto. The motor leads are connected directly to the terminal studs. The starter box in which the SCRs are mounted must be sealed so that it can be filled, during chiller operation, with the refrigerant circulated by the chiller compressor. The circulated refrigerant cools the SCRs. As a result, the SCRs represent a cooling load to the chiller system. If the refrigerant becomes contaminated, it may adversely affect SCR performance. Also, since the refrigerant is circulated by compressor operation, the circulation of cooled refrigerant to fill the starter box may be delayed when the motor is first started. Thus, refrigerant may not be available to cool the SCRs during motor starting when the semiconductor devices carry maximum motor current and generate the greatest heat. Because the semiconductor devices are immersed in a container filled with refrigerant, the gate controls for the semiconductor devices are contained in a separate box.

SUMMARY OF THE INVENTION

It is an object of the present invention to provide a solid state starter system for a motor that is not subject to the aforementioned problems and disadvantages.

It is another object of the invention to provide a solid state starter which includes water-cooled semiconductor devices that do not present the above problems.

It is a further object of the invention to provide a compact solid state starter in which the semiconductor devices, the controls for the semiconductor devices, the motor leads and the power leads are all contained in a single terminal box.

Yet another object is to provide a solid state starter which is compact and can e attached directly to the motor, thereby minimizing cabling requirements.

Additional objects and advantages of the invention will be set forth in part in the description which follows, and in part will be obvious from the description, or may be learned by practice of the invention. The objects and advantages of the invention may be realized and attained by means of the elements and combinations particularly pointed out in the appended claims.

To achieve the objects and in accordance with the purpose of the invention, as embodied as described herein, there is provided a power regulation system for an electric motor, the motor including motor power leads for connection to a source of electrical power for driving the motor. The system comprises a terminal box; a plurality of power semiconductor devices, coupled between the electric power source and the power leads and housed within the terminal box, for regulating power flow to the motor at least during a starting period of motor operation; means for cooling each semiconductor device by use of a liquid coolant, the cooling means including a sealed liquid flow element, independent of and housed within the terminal box, through which liquid coolant enters and exits; and control means coupled with the power semiconductor devices for driving the power semiconductor devices according to a control signal.

The accompanying drawings which are incorporated in and constitute a part of this specification, illustrate embodiments of the invention and, together with the description, serve to explain the principles of the invention.

DESCRIPTION OF THE PREFERRED EMBODIMENT

Figure 1:
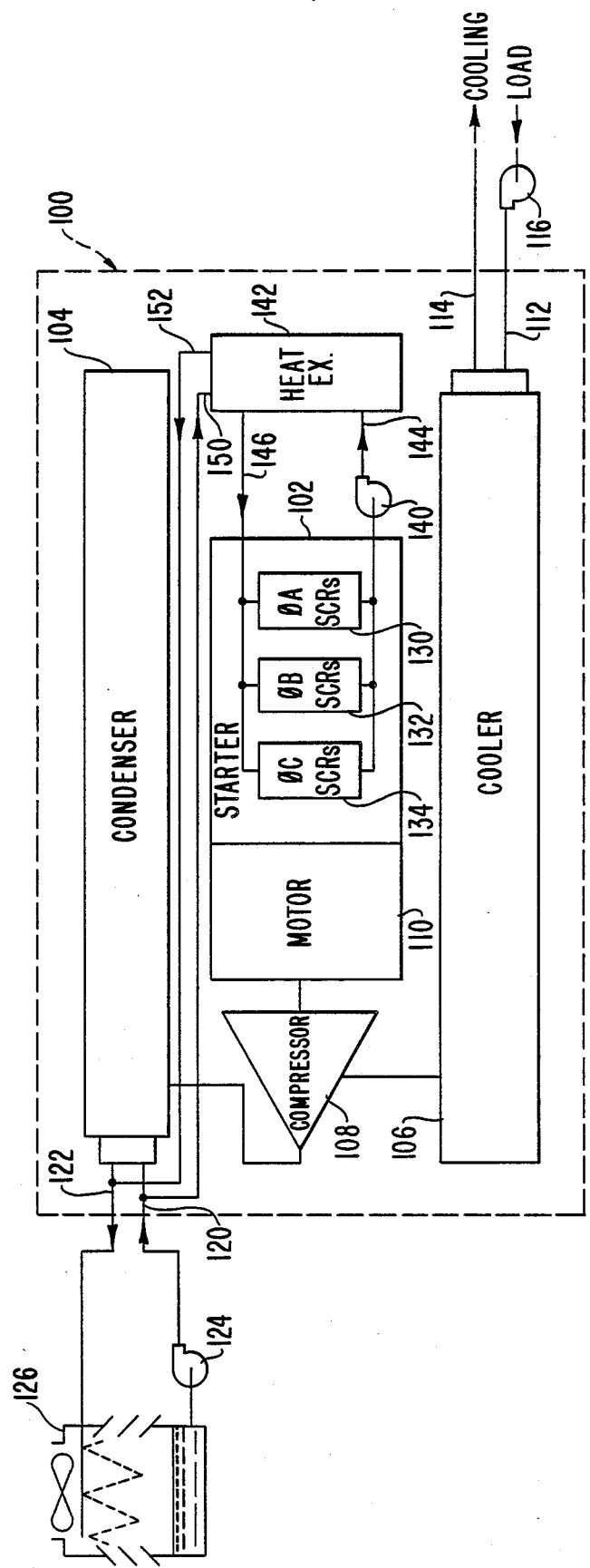
FIG. 1 diagrammatically illustrates a chiller system including a water-cooled solid state starter system made according to an embodiment of the invention.
Figure 3:
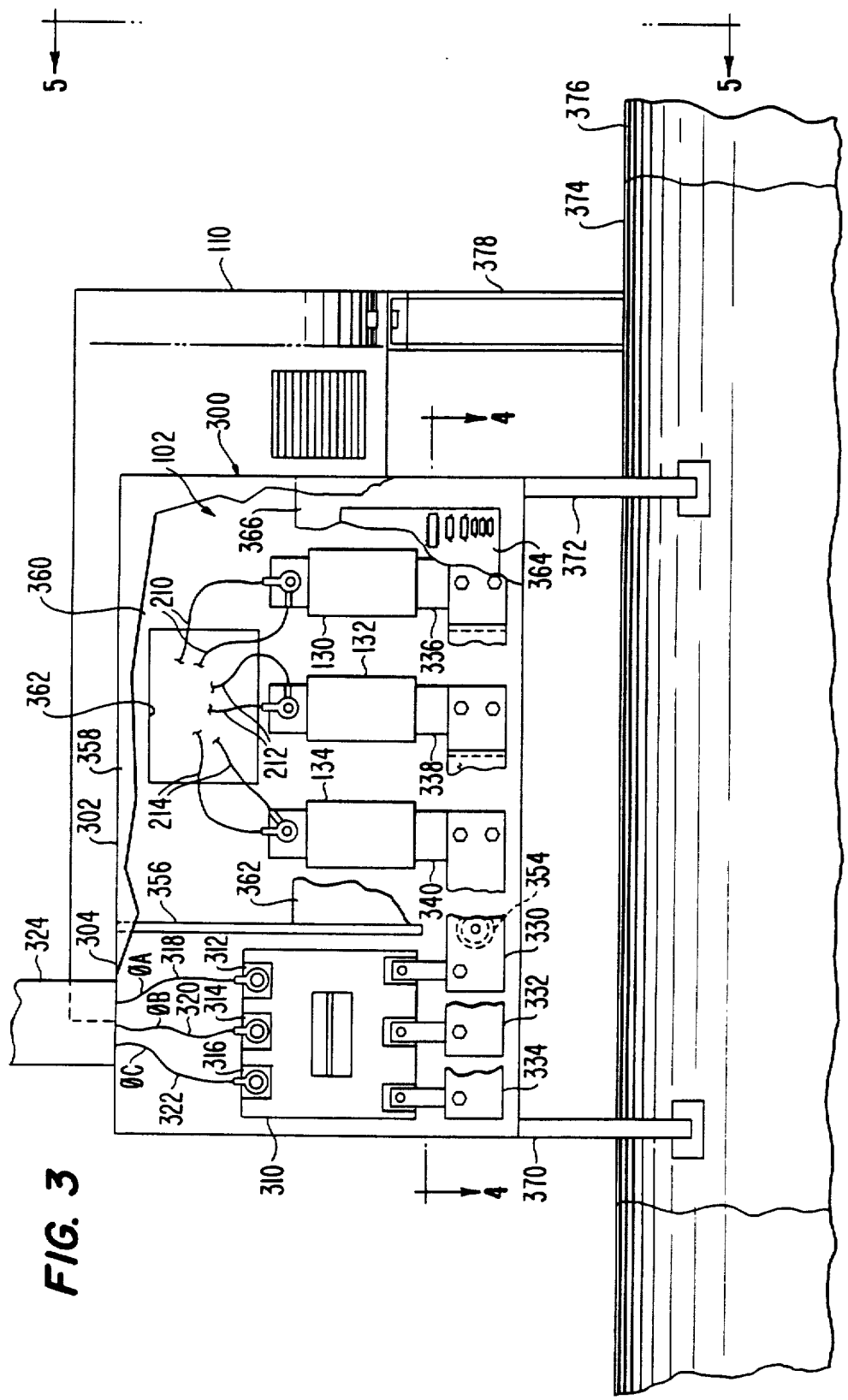
FIG. 3 illustrates a physical arrangement of the solid state starter and motor illustrated in FIG. 1.
Figure 5:
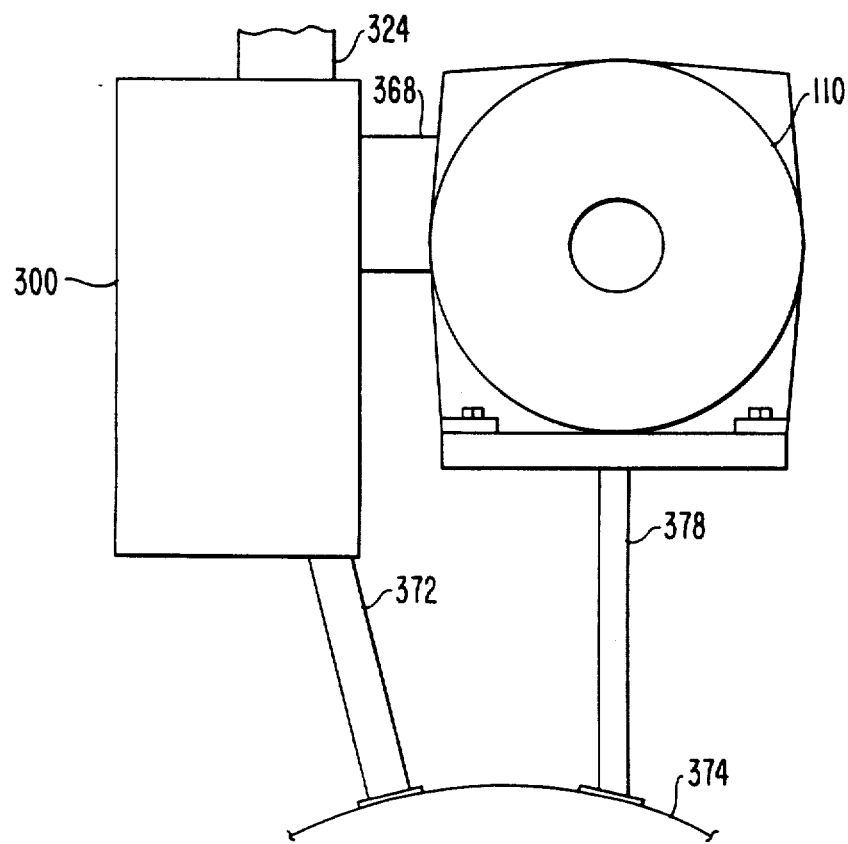
FIG. 5 illustrates section 5—5 indicated in FIG. 3.

Referring now to the drawings, FIGS. 1, 3 and 5 illustrate a skid mounted chiller system 100, such as can be employed in a commercial or industrial environment, including solid state starter apparatus 102 constructed in accordance with the invention. System 100 includes a condenser 104, a cooler 106 and a compressor 108, driven by an AC motor 110, for circulating a commercially available refrigerant, such as R-11 or R-22, between the condenser and cooler. The refrigerant circulated through cooler 106 cools water, that is received from a cooling water intake line 112 and returned to a cooling load via a cooling water discharge line 114. A pump 116 circulates the water through the cooler. Cooling water lines 112 and 114 and pump 116 comprise a primary cooling loop of the chiller system. Refrigerant heated by cooling the water passed through cooler 106 is pumped by the compressor to condenser 104 where it is cooled by cooling water circulated through a secondary cooling loop of the chiller system. The secondary cooling loop comprises an intake line 120, a discharge line 122, a circulating pump 124 and a cooling tower 126. Pumps 116 and 124, condenser 104, cooler 106 and cooling tower 126 are of standard construction.

In the preferred embodiment shown in the figures, starter 102 comprises three identical SCR modules 130, 132 and 134, cooling apparatus for the SCRs, and a control system for the SCRs. Each SCR module preferably consists of an inverse-parallel connected pair of SCRs, the three SCR modules respectively being associated with the A, B and C phases of a three phase AC power supply for driving motor 110. As described in greater detail below, the three SCR modules are preferably configured to form a three phase AC switch. Each SCR module is preferably provided as an assembled unit adapted for connection to a cooling water supply to enable water cooling thereof. While each SCR module can be provided as the above-noted open power module, a preferred construction of the module is illustrated and described hereinbelow.

A pump 140 is provided for circulating cooling water through the three SCR modules and a heat exchanger 142, the pump being connected to a return line 144 of the heat exchanger and the cooling water being discharged from the heat exchanger via a discharge line 146. Lines 144 and 146 form a primary loop of heat exchanger 142. A secondary loop of heat exchanger 142 is connected to the same secondary cooling loop as is condenser 104 via return and discharge lines 150 and 152, respectively. By operation of pump 124, a pressure difference exists between lines 120 and 122 of the secondary loop so that the flow through lines 150 and 152, respectively connected thereto, is driven by that pressure difference. Thus, the primary cooling loop of heat exchanger 142 that cools the SCR modules is a closed loop, so that concerns with respect to cooling water cleanliness are minimized. Further, the cooling of the SCR modules does not place a burden on the primary cooling loop of chiller system 100. Heat exchanger 142 is preferably provided as a tube-within-a-tube heat exchanger consisting of, for example, a ¾ inch O.D. copper tube within a 1⅛ inch O.D. copper tube, the heat exchanger primary loop water flowing through the annular space between the tubes. The construction of a preferred heat exchanger is illustrated in FIGS. 7a and 8 and described below. Pump 140 can be provided for establishing a flow rate of, for example, 4.5 gpm.

Figure 2:
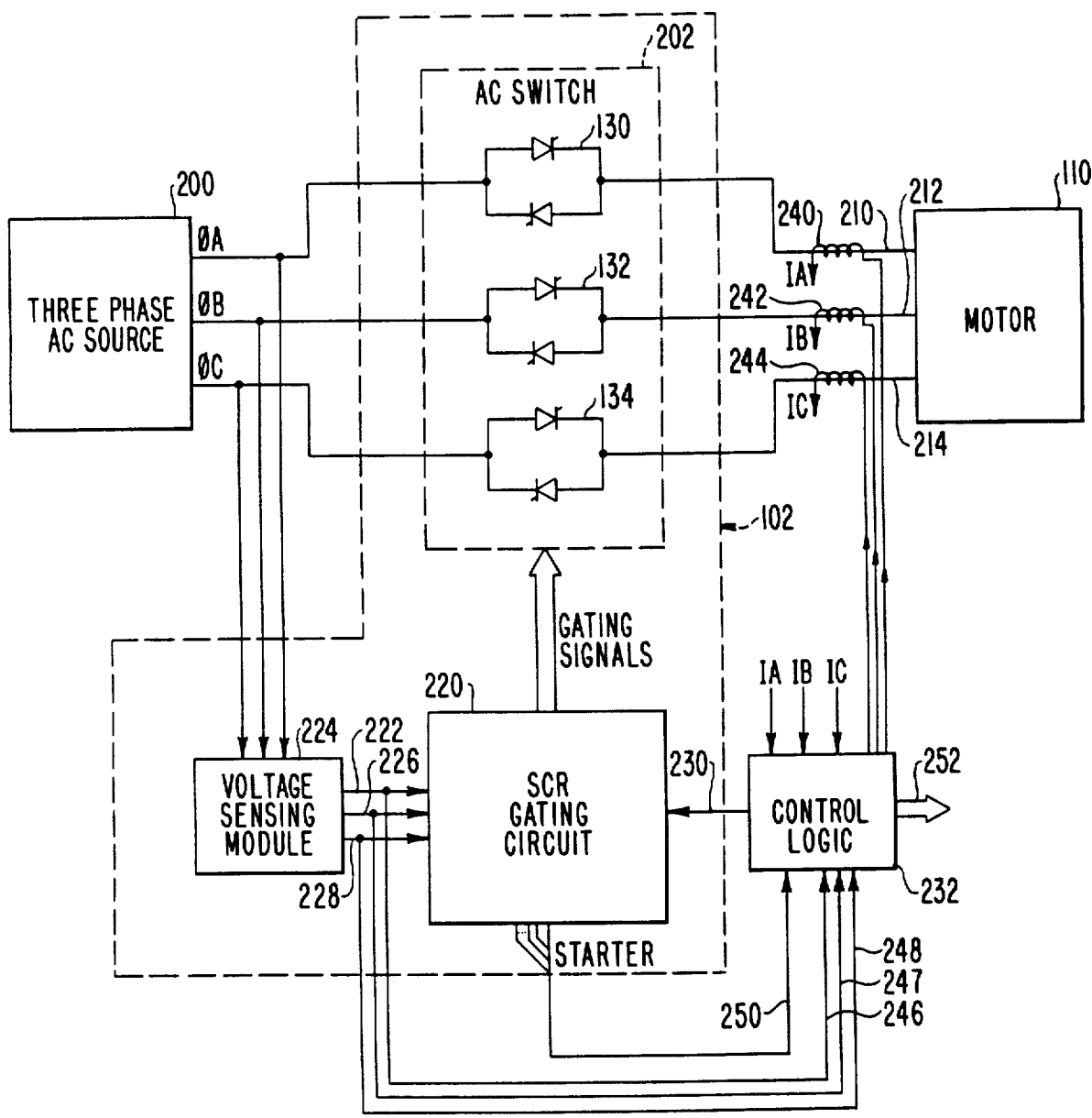
FIG. 2 diagrammatically illustrates the electrical circuitry associated with the solid state starter illustrated in FIG. 1.

FIG. 2 diagrammatically illustrates the electrical power supply to motor 110. Power is derived from a three phase AC source 200 as will normally be available in the commercial or industrial environment in which the chiller system is installed. The respective A, B and C phases of the source are connected to an AC switch 202 of starter 102. As described above, the AC switch is configured from three pairs of SCRs that respectively comprise SCR modules 130, 132 and 134, the SCR pairs of the AC switch being so labeled. As seen in FIG. 2, in the preferred embodiment, each pair of SCRs is inverse-parallel connected with the anode of one SCR connected to the cathode of the other SCR. The SCR modules 130, 132 and 134 are respectively connected to the three power lead conductors 210, 212 and 214 of the motor.

Starter 102 includes control means for driving the power semiconductor devices. As embodied herein, the control means is provided as an SCR gating circuit 220 for generating gating signals for selective application to the respective gate terminals of the SCRs. In accordance with preferred constructions of gating circuit 220, that circuit requires and is connected to receive as an input 222 a reference voltage signal representative of one line-to-line voltage, e.g., $V_{AB}$, of source 200 in order to generate the gating signals. The reference voltage signal is provided by a voltage sensing module 224 which is coupled to receive the A, B and C line voltages of the AC source. Sensing module 224 preferably comprises a three phase transformer for deriving signal level voltages corresponding to the source line-to-line voltages. It is preferred herein that detection circuitry for detecting an open phase or incorrect phase rotation be included with the SCR gating circuit. Sensing module 224 therefore also provides signals representative of the remaining two line-to-line voltages, e.g., $V_{BC}$ and $V_{CA}$, on lines 226 and 228 for application to the detection circuitry.

In a manner known in the art, the gating circuit, as preferably constructed, also requires and is connected to receive, on an input 230, a power control signal representative of the voltage required between lead conductors 210, 212 and 214 to produce the proper magnitude of current that should flow to motor 110. In order to provide the power control signal, system 100 further includes a control logic unit 232 that is coupled to receive signals representative of the current flowing in each lead conductor 210, 212 and 214 of motor 110. Three current sensing devices in the form of current transformers 240, 242 and 244 are respectively coupled to motor leads 210, 212 and 214 to provide current signals $I_A$, $I_B$ and $I_C$ respectively proportional to the current flowing in those leads. Control logic 232 includes circuitry to compare the actual current flow in the motor leads with a preset maximum current magnitude and generates the power control signal responsive to the comparison.

In accordance with a preferred construction of system 100, control logic 232 is connected to receive, on lines 246, 247 and 248, the three voltage signals representative of the three source line-to-line voltages. The control logic can be further connected to receive, on control lines 250, signals from the above-described detection circuitry, signals representative of SCR operating temperature, a run/stop signal and an out-of-lock condition of a phase locked loop of gating circuit 220. The control logic is preferably responsive to indications of adverse conditions such as open phase, incorrect phase rotation or high SCR temperature to suspend generation of the power control signal, with the result that the SCRs cease to conduct. It is further preferred that control logic 232 provide a visual display of the source voltage and motor currents and/or telemetry signals representative of at least those parameters on an output 252 thereof for transmission to, for example, a user monitoring station. A preferred control logic unit is manufactured by York International Corporation, the present assignee, as a part of a Microcomputer Control Center.

SCR gating circuit 220 can be provided as the gating circuit disclosed in commonly assigned U.S. Pat. No. 4,499,534 to Schnetzka et al., the disclosure of that patent being incorporated in its entirety herein by reference. In a preferred embodiment, circuit 220 would be provided as a gating circuit disclosed in commonly assigned, copending U.S. patent application Ser. No. 07/291,776, entitled "Control For Three-Terminal Power Semiconductor Devices" naming H. R. Schnetzka and F. E. Wills as inventors and filed on Dec. 29, 1988, which is hereby incorporated by reference. That application and this application are commonly owned. Additionally, gating circuit 220 can be provided as other circuits known in the art and suitable for generating control signals for controlling the operation of three-terminal semiconductor devices.

FIG. 3 illustrates a preferred physical configuration of the starter 102 mounted in a terminal box of motor 110 in system 100. Starter 102 is contained in a sheet metal terminal box 300 of motor 110. The terminal box includes a compartment 302 that contains the semiconductor devices 130, 132 and 134. The box also includes a compartment 304 that contains an optional conventional molded case disconnect switch 310.

As shown in FIG. 3, terminal pads 312, 314 and 316 of the disconnect switch are respectively connected to power cables 318, 320 and 322 that are respectively supplied from phases A, B and C of source 200. The power cables preferably enter compartment 304 through a conduit 324.

Figure 4:
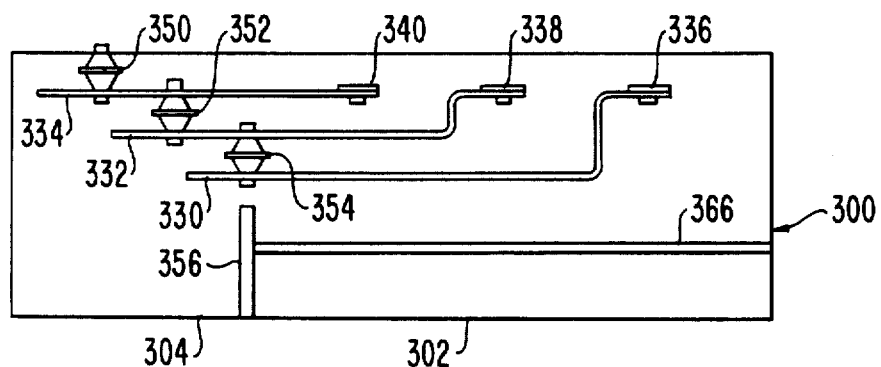
FIG. 4 illustrates section 4—4 indicated in FIG. 3.

The disconnect switch load terminals are connected to transverse bus bars 330, 332 and 334. Bus bars 330, 332 and 334 provide connection between the disconnect switch load terminals and terminal pads 336, 338 and 340 of SCR modules 130, 132 and 134, respectively. FIG. 4 illustrates section 4—4 in FIG. 3 and shows the configuration of each transverse bus bar. Also shown in FIG. 4 are insulators 350, 352 and 354 for supporting bus bars 330, 332 and 334. The SCR modules are set toward the rear of terminal box 300, so as to be proximate the motor. The gating control circuit 220 is positioned toward the front of terminal box 300.

As shown in FIGS. 3 and 4, a barrier 356 for separating compartments 302 and 304 extends the full height of terminal box 300 adjacent the SCR modules, but the lower portion of the barrier is cut to permit passage of the bus bars. The barrier 356 extends to a cover plate 358 (partially shown) of the terminal box which can be removed during installation or repair of the starter. A rear wall 360 of the terminal box includes an aperture 362 through which the motor leads can be inserted.

SCR gating circuit 220 is configured on a circuit board 364 which is mounted on a circuit mounting panel 366, a portion of the circuit board being diagrammatically shown in FIG. 3. The voltage sensing module circuitry is also preferably mounted within compartment 302. Thus, the SCR modules and gating circuit comprising starter 102 are mounted within the terminal box of motor 110. This function of terminal box 300 is further illustrated in FIG. 5, which is section 5—5 of FIG. 3. It is thus seen that terminal box 300 is mounted on motor 110. An adaptor 368, having a rectangular cross section, is provided for attaching terminal box 300 to an opening in motor 110 from which the motor power leads emanate. The retangular opening 362 in rear wall 360 of terminal box 300 is aligned with adaptor 368. Motor leads 210, 212 and 214 therefore project through opening 362 and are respectively terminated on SCR modules 130, 132 and 134. As illustrated in FIG. 3, each phase lead can consist of two conductors as is known in the art.

Referring again to FIG. 3, terminal box 300 is supported by two members 370 and 372, e.g., channel steel members, that are affixed to a cylindrical member 374 constituting cooler 106 (FIG. 1) of system 100. As viewed in FIG. 3, a cylindrical member 376 is positioned behind member 374 and constitutes condenser 104 of system 100. Motor 110 is supported at one end by its coupling to compressor 108 (not shown in FIG. 3) and at the opposite end thereof by a member 378 that is affixed to member 374.

Figure 6:
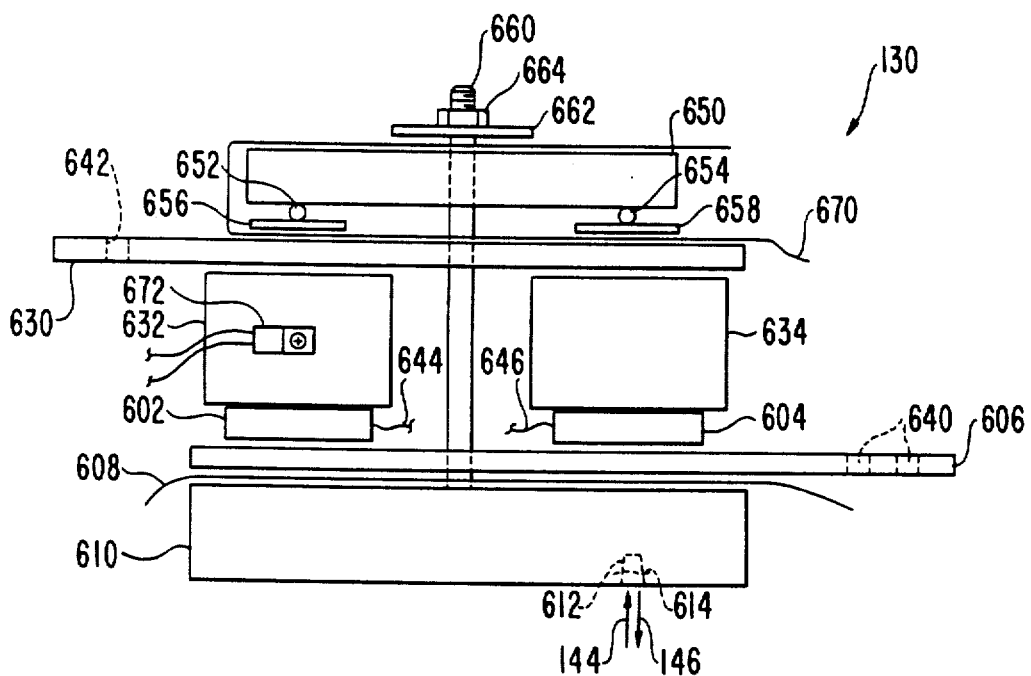
FIG. 6 illustrates a preferred construction of a module for a water-cooled semiconductor device.

FIG. 6 illustrates a preferred construction of module 130 that is identical to modules 132 and 134. This preferred construction is disclosed in commonly assigned, copending U.S. patent application Ser. No. 07/291,780, entitled "System For Mounting and Cooling Power Semiconductor Devices," naming D. K. Norbeck and H. R. Schnetzka as the inventors and filed on Dec. 29, 1988. That application is commonly owned and is hereby incorporated by reference. Module 130 comprises semiconductor disc type devices in the form of SCRs 602 and 604 that are in conductive contact with a bus type terminal bar 606, that bar preferably being fabricated of copper. Module 130 includes means for cooling the semiconductor devices by use of a liquid coolant. As embodied herein, the cooling means is provided as a water-cooled plate 610. A sheet of insulating material 608, such as Cho-therm 1671 manufactured by Chomerics, Inc., of Hudson, N.H., having a nominal thickness of 0.015 inches, electrically insulates terminal bar 606 from water-cooled plate 610. Plate 610 is preferably fabricated from copper and has water flow passages therein that communicate with water inlet 612 and outlet 614 in FIG. 6, for the circulation of a liquid coolant, such as water, through the plate. The liquid coolant circulated through plate 610 is illustrated as being received (arrow 144) from heat exchanger 142 (FIG. 1), the coolant discharged from the plate being returned (arrow 146) to the heat exchanger. The water inlet is illustrated as being positioned directly behind outlet 614 in FIG. 6.

Module 130 also includes a bus type terminal bar 630 that is preferably fabricated of copper. Module 130 further includes two thermal heat sink masses in the form of metallic blocks 632 and 634 that are respectively interposed between SCRs 602 and 604 and terminal bar 630. Blocks 632 and 634 are preferably rectangular in shape and composed of copper. Blocks 632 and 634 are in electrical conductive contact with terminal bar 630 and, respectively, SCRs 602 and 604. Further, the blocks are also in thermal conductive contact with the respective SCRs 602 and 604 and with terminal bar 630. Each block 632,634 provides an electrical conductive path between terminal bar 630 and the SCR in contact therewith. It is noted that while each block 632,634 is preferably interposed between terminal bar 630 and one of the SCRs, terminal bar 630 could instead be interposed between each block and the corresponding SCR.

With SCRs 602 and 604 arranged such that the cathode pole face of one and the anode pole face of the other each abut the same terminal bar, the above-described inverse-parallel electrical configuration of each semiconductor module of AC switch 202 is achieved. Holes 640 and 642 are respectively provided in terminal bars 606 and 630 to enable electrical connection to the transverse bus bars and the motor terminal leads, respectively. Gate leads 644 and 646, for receiving gating signals, are shown emanating from SCRs 602 and 604, respectively.

Module 130 further includes a pressure plate 650, e.g., fabricated from stainless steel, for applying pressure to terminal bar 630 via ball bearings 652 and 654 and metallic discs 656 and 658. Each bearing and metallic disc are positioned in vertical alignment with the center of one of the SCRs. A through bolt 660 passes through pressure plate 650, terminal bars 606 and 630 and insulating material 608 and is anchored, by means not shown, in cooling plate 610. The end of bolt 660 projecting through pressure plate 650 is threaded to receive a spring washer 662 and a nut 664. Nut 664 is tightened to exert a compressive mounting force across terminal bars 606 and 630 to compress the two metallic blocks and semiconductor devices. The arrangement of the pressure plate, bearings and metallic discs serves to evenly apportion the compressive force between the two SCRs. Through bolt 660 is insulated from terminal bars 606 and 630 preferably by insulating sleeving. A sheet of electrical insulating material 670, such as Aramid insulating paper (manufactured as Nomex TM insulating material by E. I. DuPont de Nemours Co., Inc., of Wilmington, Del.) having a thickness of 0.030 inches is provided to electrically insulate the terminal bar from pressure plate 650, ball bearings 652,654 and metallic discs 656,658. Block 632 is prefererably provided with a thermistor 672 connected to monitor block temperature during operation of the semiconductor devices.

In the operation of system 100, motor 110 is energized by starter 102 to drive compressor 108 so that refrigerant is circulated between condenser 104 and cooler 106 to enable provision by cooler 106 of cooling water to the cooling load. During motor starting, the motor current is monitored by control logic 232 that responsively generates a power control signal that is applied to the SCR gating circuit. The gating circuit, in response to the power control signal and a reference voltage signal received from the voltage sensing module, generates gating signals for selective application to the SCRs of AC switch 202, and the motor starting current is limited in magnitude to the predetermined maximum current. The SCRs generate heat during operation and are cooled, in part, by cooling water circulated through the water-cooled plate in contact therewith. The SCR cooling water is circulated as a primary cooling loop of heat exchanger 142. The secondary loop of heat exchanger 142 is tapped from return and discharge lines 120 and 122 of chiller system condenser 104. The condenser return and discharge lines are connected to the chiller secondary cooling loop including cooling tower 126. The pressure difference between lines 120 and 122 drives circulation of the cooling tower water through heat exchanger 142.

The liquid coolant applied to cool the SCRs has a temperature which is always equal to or above the temperature of the water in the cooling tower. As a result, the temperature of the SCRs always remains above the dew point of the ambient air. Cooling of the SCRs, therefore, will not cause condensation which could degrade the operation of the starter.

In accordance with the operation of preferred SCR module 130, as illustrated in FIG. 6 the amount of SCR junction heat generated during motor starting is greater than the amount generated during motor steady state operation. A significant portion of the SCR junction heat generated during a transient period of operation corresponding to motor starting, and the conduction of motor starting current, is absorbed by each metallic block therein. A lesser portion of the starting heat and the major portion of SCR junction heat generated during the period of motor steady state operation is absorbed by the water-cooled plate.

Chiller system 100 is preferably constructed as a skid mounted unit and includes, as illustrated in FIG. 1, condenser 104, cooler 106, compressor 108, motor 110, starter 102, pump 140 and heat exchanger 142 all mounted on a common structural base. Further, starter 102 comprising SCR gating circuit 220 and AC switch 202 including water-cooled SCR modules 130, 132 and 134, is mounted within the terminal box which is directly connected to the motor.

Figure 7B:
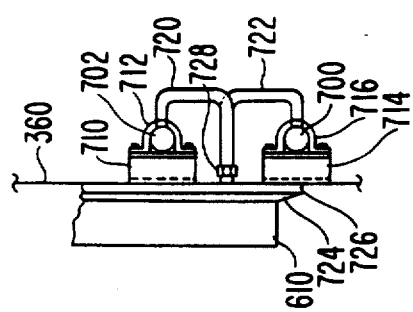
FIGS. 7a and 7b illustrate a sealed liquid circuit for circulating cooling water to SCR modules.
Figure 7A:
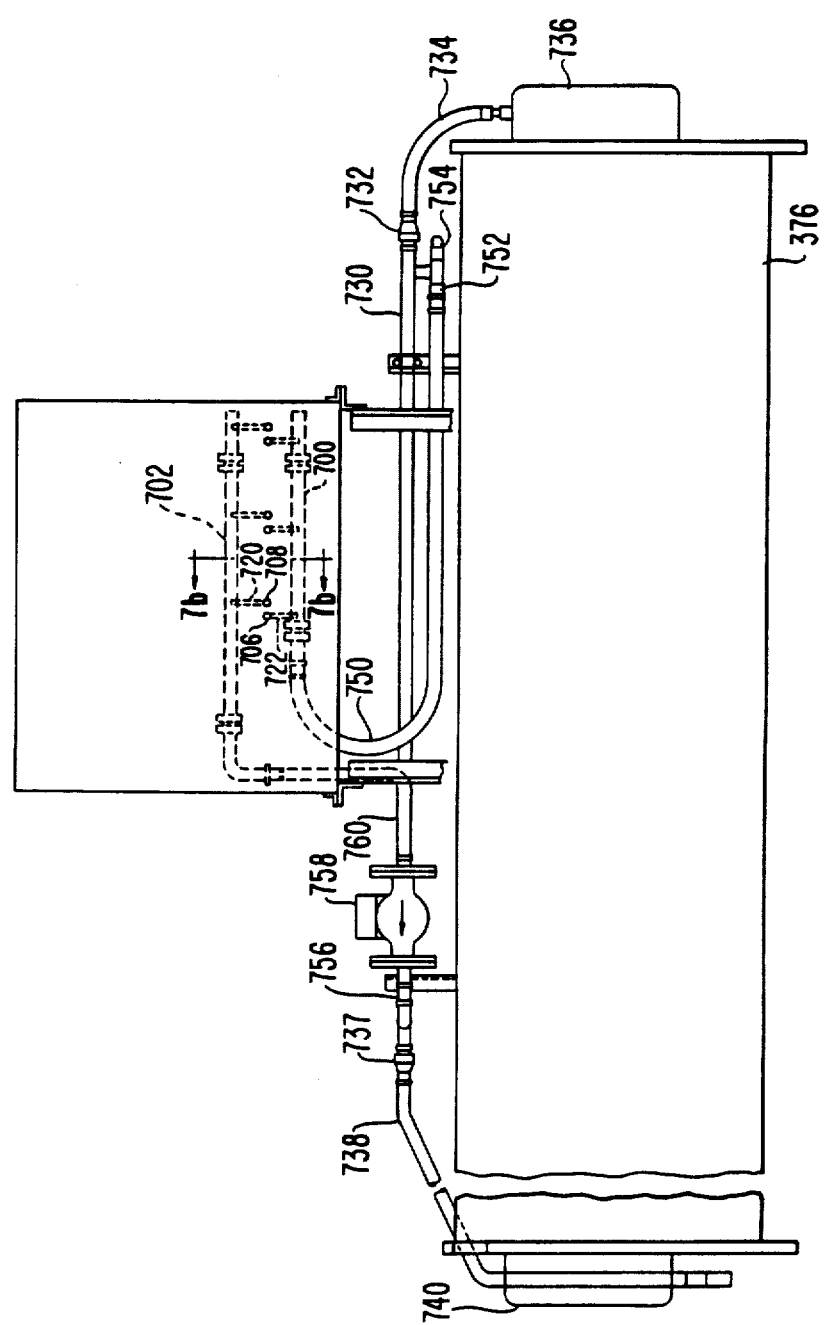
Figure 8:
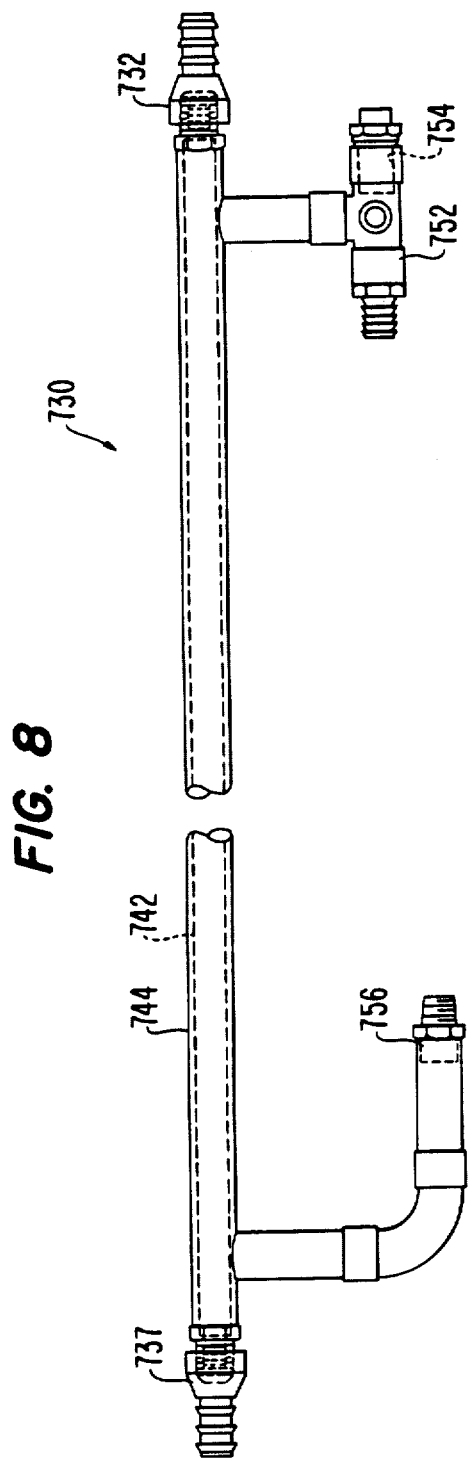
FIG. 8 illustrates the construction of a preferred heat exchanger.
Figure 2:
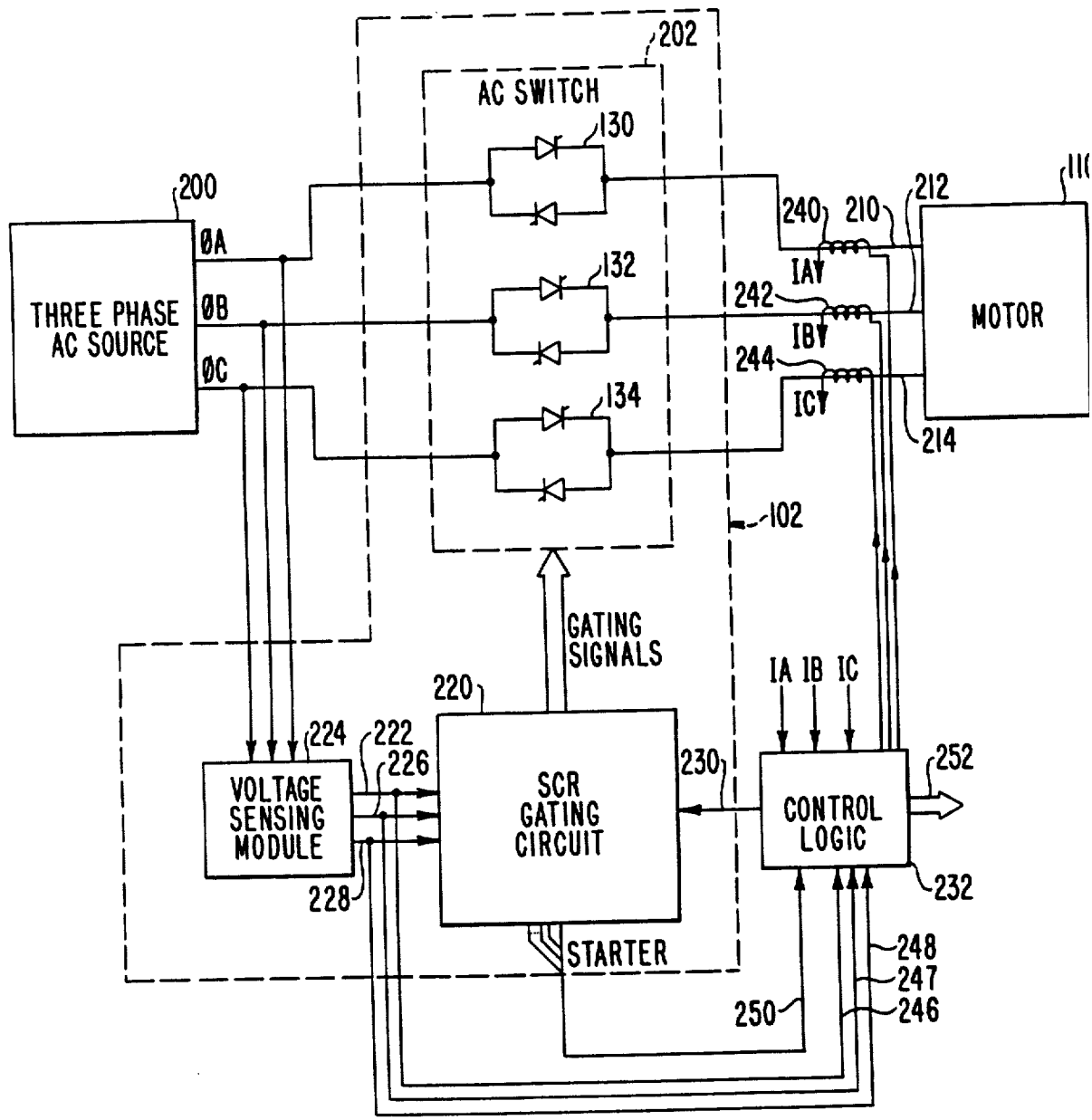
Figure 4:
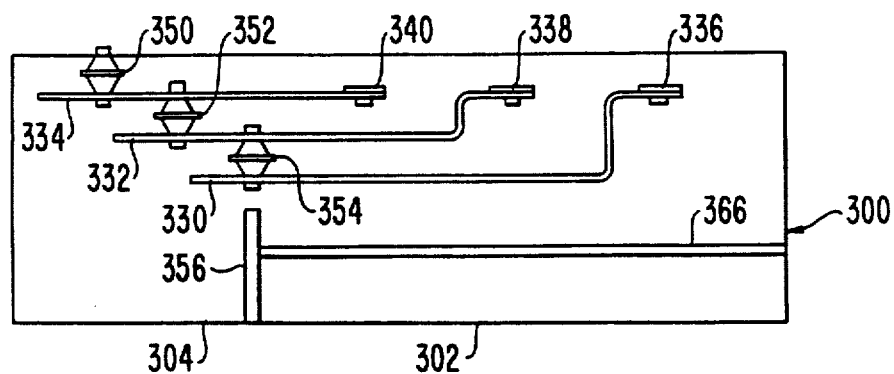
Figure 5:
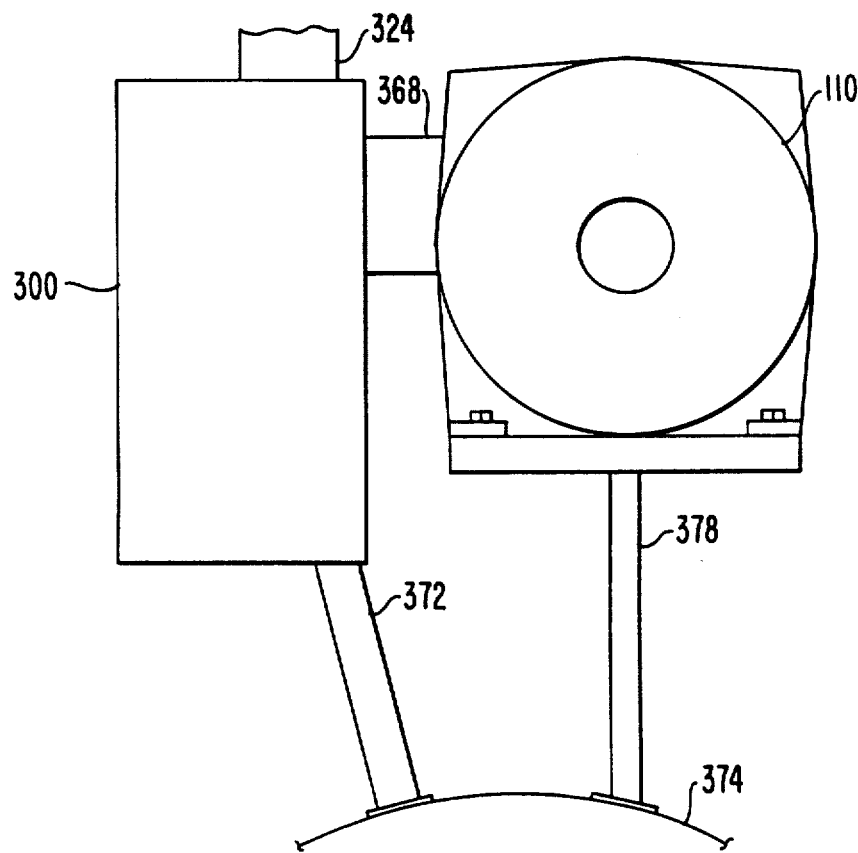
Figure 6:
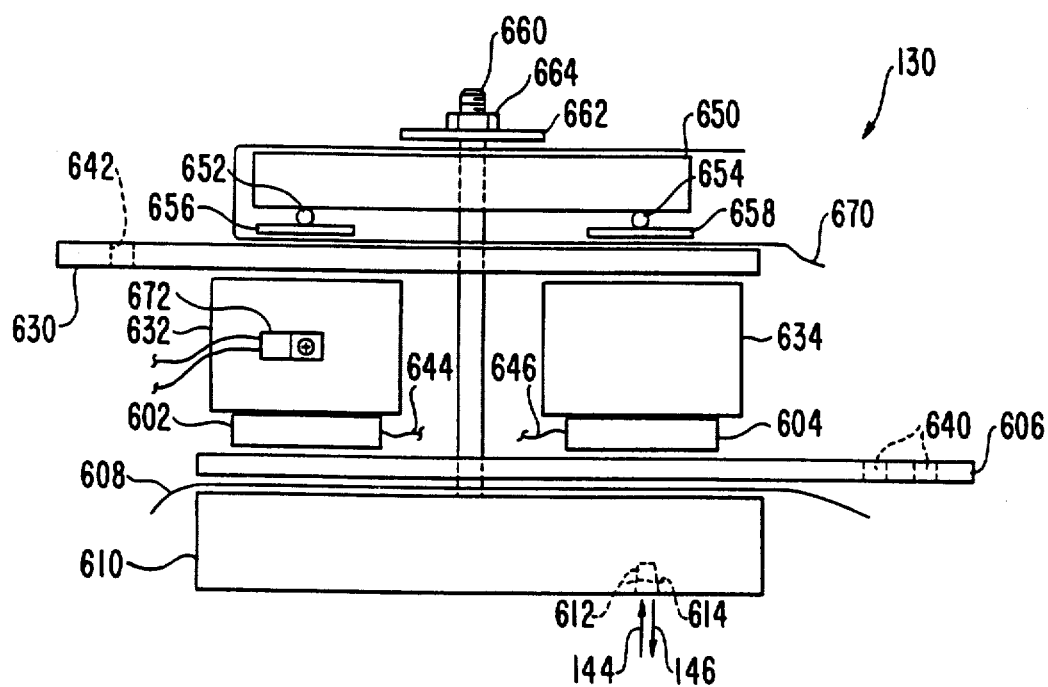
Figure 8:
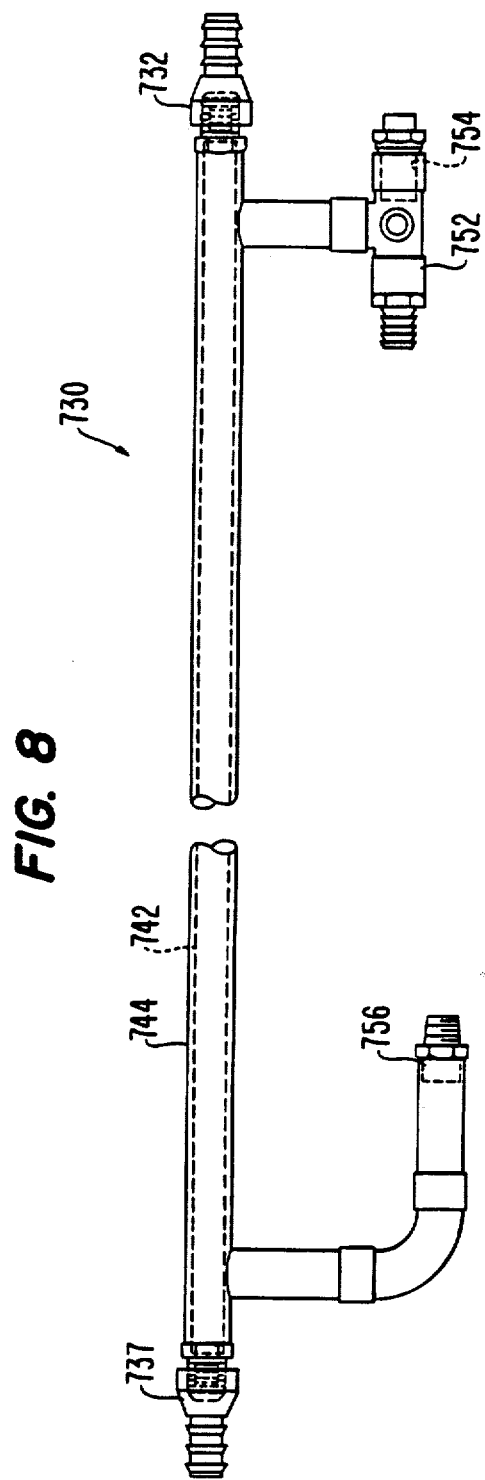

FIGS. 7a and 7b illustrate the sealed liquid circuit provided for circulating cooling water to three preferred SCR modules identical to module 130 illustrated in FIG. 6. In FIG. 7a, terminal box 300 is viewed from the front, as in FIG. 3. However, only the elements of the liquid circuit as mounted on the exterior rear surface of the terminal box are shown. Further, cylindrical member 374 which constitutes cooler 106 is not shown in FIG. 7 in order to more clearly show connections of the sealed liquid circuit to condenser 104 in the form of cylindrical member 376.

Referring to FIG. 7a, an inlet header line 700 and an outlet header line 702 are horizontally mounted on the external surface of rear wall 360 of terminal box 300. A pair of holes, such as holes 706 and 708, are provided in rear wall 360 for each SCR module. Each pair of holes is positioned to align with inlet 612 and outlet 614 of the preferred SCR module. FIG. 7b, which is section 7b—7b in FIG. 7a, shows a portion of water-cooled plate 610 of one SCR module mounted on the interior surface of rear wall 360, the plate being intentionally omitted from FIG. 7a for clarity. Each header 700,702 is clamped to support brackets, e.g., fabricated of steel, mounted on the external surface of rear wall 360. FIG. 7b illustrates support bracket 710 and clamp 712 for supporting header 702 and support bracket 714 and clamp 716 for supporting header 700. A tap line 720 connects between header 702 and outlet 614 of the SCR module through hole 708. Similarly, a tap line 722 passes through hole 706 and connects header 700 with module inlet 612. A gasket 724 is positioned between a peripheral portion of water-cooled plate 610 and a mounting plate 726 to prevent water leakage from the connections to the module water inlet and outlet from entering the interior of terminal box 300, mounting plate 726 being fastened to wall 360. Each inlet and outlet is preferably provided as a threaded opening for receiving a threaded male element of a compression fitting on each tap line, such as element 728 on tap line 710, to seal the connection between the tap line and water-cooled plate.

Referring again to FIG. 7a, inlet header 700 connects to an outlet of a preferred tube-in-tube heat exchanger 730. The construction of heat exchanger 730 is illustrated in FIG. 8. An inlet 732 of the heat exchanger is connected, via a water line 734, to a water box 736 mounted at one end of the condenser. An outlet 737 of the heat exchanger is connected, via a line 738, to a water box 740 mounted at the other end of the condenser. As a result of the pressure difference between water boxes 736 and 740, cooling water from the condenser flows as the secondary coolant through an inner tube 742 of the heat exchanger. The primary coolant of the heat exchanger, which is circulated through the SCR modules, passes through the annular space formed between inner tube 742 and outer tube 744. The primary coolant is thus cooled by the secondary coolant. Inlet header 700 is connected through a line 750 to a primary coolant outlet 752 of the heat exchanger. Outlet 752 is part of a T-connection that includes a plugged drain 754. A primary coolant inlet 756 of the heat exchanger is connected to a discharge side of a circulating pump 758. The suction side of the pump is connected to header 702 via a line 760. Thus, pump 758 circulates primary coolant out of outlet header 702, through the heat exchanger and back into inlet header 700. Heat exchanger 730 and pump 758 respectively correspond to heat exchanger 142 and pump 140 illustrated in FIG. 1. Further, lines 734 and 738 respectively correspond to lines 150 and 152 shown in FIG. 1. Additionally, heat exchanger outlet 752 and inlet 756 respectively correspond to lines 146 and 144 in FIG. 1. It is noted that the orientation of heat exchanger inlet 756 and the pipe section connecting it to outer tube 744 are positioned differently in FIG. 8 than in FIG. 7a in order to more clearly illustrate the construction of the heat exchanger.

Thus, the three modules provided as preferred module 130 illustrated in FIG. 6 are positioned within the terminal box and each includes water-cooled plate 610 that represents a sealed liquid flow element contained within the box. Further, these sealed liquid flow elements are connected to a sealed liquid flow circuit mounted external to the terminal box, that circuit including the heat exchanger for cooling the liquid circulated through the liquid cooled plates. It is noted that while it is preferred herein to mount all piping external to the terminal box, some portion of that piping, e.g., headers 700 and 702, could be mounted within the terminal box.

While the present invention has been illustrated and described as comprising a water-cooled motor starter incorporated into a chiller system, the invention is not limited to that environment. Heat pump systems are mechanically configured analogous to chiller system 100 and utilize a compressor to circulate a refrigerant to provide heating or cooling to an external load. Such systems also have access to an external cooling water source such as may be utilized by heat exchanger 142 without placing a cooling burden on the system. Further, the invention is not limited to motor starters incorporated into chiller or heat pump systems. The motor terminal box mounted water-cooled starter may be incorporated in any motor application where it is desired to employ a compact solid state starter and a suitable source of cooling water is available.

While the motor terminal box mounted, water-cooled starter of the invention has been illustrated as being cooled through a heat exchanger dedicated solely to the starter, other types of heat exchangers and liquid cooling sources could be used. Where an open cooling loop source of cooling water, i.e., a loop in which the water carrying the SCR generated heat is not returned to the SCRs, is available, such a cooling source can be used subject to the above-noted concerns regarding water cleanliness and dew point. Further, in cases where a cooling source including a heat exchanger is available and the cooling burden represented by the SCRs is not a concern, such cooling sources can, of course, be used as well.

While the starter of the invention has been illustrated and described as including SCRs cooled with water, other coolants could also be used to cool the SCRs. Upon availability, other liquid coolants may be circulated for cooling the SCRs subject to the above-noted concerns regarding cleanliness and dew point.

While the motor terminal box mounted starter of the invention has been illustrated and described as including SCRs, the invention may be practiced with equal effectiveness with any semiconductor devices, e.g., power transistors, that are configured to regulate the flow of current to the motor.

While the motor terminal box mounted starter of the invention has been illustrated and described as comprising an AC switch for regulating power flow to an AC motor, the invention also applies to other forms of motor control. For example, DC motor operation can be regulated by selective operation of three-terminal semiconductor devices configured as a rectifier circuit coupled between a power supply and the DC motor. Thus, the rectifier circuit may be mounted in the motor terminal box of the DC motor and comprise water-cooled three-terminal semiconductor devices. Further, the invention can be practiced with a starter comprising a solid-state inverter to drive a variable speed motor. Additionally, the invention can be practiced with equal effectiveness on a single phase system, or a polyphase system having other than three phases.

In the preferred embodiment, the voltage sensing module is mounted with the gating circuit. However, the invention can as well be practiced with the voltage sensing module considered as an external source of the reference voltage signal and mounted separately from the gating circuit.

The present invention provides an improved solid state starter which is compact in size and can be connected directly to the motor, thereby minimizing cabling. In particular, wiring and conduit is eliminated between the motor and starter, and between the semiconductor elements and a separate box for the gate controls for the semiconductor devices. The heat generated by the starter is expelled to the cooling tower, not the local environment or the air conditioning system. The cooling requirements for the starter, therefore, do not reduce the air conditioning capacity of the chiller. Moreover, the problems associated with potential condensation are eliminated, since the temperature of the cooling tower water is always equal to or greater than the dew point. Problems of contamination and thermal shock are also eliminated by not using system refrigerant to directly cool the semiconductors in a flooded cooler. Further, the present invention does not require the connection of the starter to the refrigerant circuits of the chiller. In addition, the compressor does not have to be running in order to provide cooling for start-up and post-run.

Thus, it is intended that the present invention cover the modifications and variations of this invention provided they come within the scope of the appended claims and their equivalents.

What is claimed is:

1. A power regulation system for an electric motor, said motor including motor power leads for connection to a source of electrical power for driving the motor, said system comprising:
   a terminal box;
   a plurality of power semiconductor devices, coupled between the electric power source and the power leads and housed within said terminal box, for regulating power flow to the motor at least during a starting period of motor operation;
   means for cooling each said semiconductor device by use of a liquid coolant, said cooling means including a sealed liquid flow element, independent of and housed within said terminal box, through which liquid coolant enters and exits; and
   control means coupled with said power semiconductor devices for driving said power semiconductor devices according to a control signal.

2. The power regulation system of claim 1 wherein said control means is contained within said terminal box.

3. The power regulation system of claim 1 wherein said terminal box is located immediately adjacent the motor.

4. The power regulation system of claim 3 wherein the power leads of the motor project directly into said terminal box where they are coupled with said semiconductor devices.

5. The power regulation system of claim 4 wherein the lines from the power source project directly into said terminal box where they are coupled with said semiconductor devices.

6. The power regulation system of claim 1 wherein said sealed liquid flow element is coupled with a sealed liquid coolant flow circuit located outside said terminal box, said cooling means including a heat exchanger coupled with said sealed flow circuit.

7. The power regulation system of claim 6 wherein said heat exchanger and said sealed liquid flow circuit form a closed loop of liquid coolant and means for accepting heat from said liquid coolant.

8. The power regulation system of claim 1 wherein each said semiconductor device is a three-terminal power semiconductor device that is driven into a conduction mode by application of signals from said control means.

9. The power regulation system of claim 1 wherein said electrical power source is a polyphase AC source and said semiconductor devices are arranged to form an AC switch.

10. The power regulation system of claim 1 wherein said liquid coolant is water.

11. The power regulation system of claim 1 wherein said semiconductor devices are silicon controlled rectifiers (SCRs).

12. A power regulation system for an electric motor, said motor including motor power leads for connection to a source of electrical power for driving the motor, said system comprising:
    a terminal box;
    a plurality of power semiconductor devices, coupled between the electrical power source and the power leads and housed within said terminal box, for regulating power flow to the motor during transient start-up operation and steady-state operation;
    means for cooling each said semiconductor device by use of a liquid coolant, said cooling means including a sealed liquid flow element, independent of and housed within said terminal box, through which liquid coolant enters and exits;
    means for providing a control signal representative of the desired power flow to the motor; and
    control means coupled with said power semiconductor devices and said control signal means for driving said power semiconductor devices according to the control signal, said control means being housed within said terminal box.

13. The power regulation system of claim 12 wherein said sealed liquid flow element is coupled with a sealed liquid coolant flow circuit located outside said terminal box, said cooling means including a heat exchanger coupled with said flow circuit, said heat exchanger and said sealed liquid flow circuit forming a closed loop of liquid coolant.

14. The power regulation system of claim 13 wherein said terminal box is physically connected to the motor and the power leads of the motor project directly into said terminal box where they are coupled with said semiconductor devices.

15. The power regulation system of claim 13 wherein said cooling means includes one or more solid metallic blocks in physical contact with said semiconductor devices for serving as a heat sink during starting of the motor.

16. The power regulation system of claim 12 wherein each said semiconductor device is paired as a first semiconductor device with a second one of said semiconductor devices in a device module, each said device module comprising a liquid cooled heat sink in thermal contact with said semiconductor devices to receive heat generated within said first and second semiconductor devices during device operation, said liquid cooled heat sink forming a part of the sealed liquid flow circuit of said cooling means, and a solid heat sink in thermal contact with said semiconductor devices to receive heat within said first and second semiconductor devices during device operation, said liquid cooled heat sink and said solid heat sink having respective first and second predetermined heat capacities to maintain a junction temperature in each said first and second semiconductor device at or below a predetermined maximum junction temperature during predetermined transient and steady state periods of device operation.

17. The apparatus of claim 12 wherein said source is a polyphase AC source and said liquid coolant is water.

18. A chiller system for providing cooling to an external cooling load, said chiller system including a compressor driven by an AC motor, said motor including a set of power leads for coupling to a polyphase AC electrical source, said chiller system comprising:
an AC switch, for coupling between said AC motor and the AC source, to regulate electrical power flow to said motor during transient start-up operations and steady-state operations;
a terminal box mounted on said motor;
said AC switch comprising a plurality of three-terminal power semiconductor devices configured to form said AC switch and housed within said terminal box, each said semiconductor device being driven into a conduction mode by applying a conduction control signal to a control terminal of the device;
means for cooling each said semiconductor device by use of a first liquid coolant, said cooling means including a sealed liquid flow element, independent of and housed within said terminal box, through which liquid coolant enters and exits;
means for providing a control signal representative of the desired power flow to the motor;
control means coupled with said power semiconductor devices and said control signal means for driving said power semiconductor devices according to the control signal, said control means being mounted within said terminal box, a set of load terminals of said AC switch being connected to said motor power leads; and
said AC switch including a set of line terminals for coupling to the AC source.

19. The chiller system of claim 18 wherein said sealed liquid flow element is coupled with a sealed liquid coolant flow circuit located outside said terminal box, said cooling means including heat exchanger means coupled with said sealed liquid flow circuit for cooling the first liquid coolant, said heat exchanger means being coupled to receive a second liquid coolant for cooling said first liquid coolant, said heat exchanger means being located outside said terminal box and forming a closed loop of liquid coolant with said sealed liquid flow circuit.

20. The chiller system of claim 19 further including condenser means coupled to a cooling source via discharge and return lines through which said second coolant can flow, said heat exchanger means being coupled to said discharge and return lines so that said second coolant can be driven to flow through said heat exchanger means by a pressure difference between said discharge and return lines.

21. The chiller system of claim 20 wherein said chiller, said motor, said condenser and said heat exchanger are mounted on a common structural base.

22. The chiller system of claim 21 wherein said semiconductor devices are silicon controlled rectifiers (SCRs); and
said control means generating gating signals for selective application to respective gate terminals of said SCRs.

23. The chiller system of claim 22 wherein said polyphase AC source is a three phase AC source; and
said motor is a three phase AC motor.

24. The chiller system of claim 18 wherein said semiconductor devices are SCRs; and
said control means generating gating signals for selective application to respective gate terminals of said SCRs.

25. The chiller system of claim 24 wherein said first liquid coolant is water.

26. The chiller system of claim 18 further including a disconnect switch coupled at one end to respective line terminals of said AC switch and having terminals at an opposite end for connecting to electrical conductors from the AC source.

27. The chiller system of claim 18 wherein said AC switch comprises a different pair of SCRs for each phase of said polyphase source, the SCRs of each SCR pair being electrically connected in inverse-parallel with an anode of one SCR being connected to a cathode of the other SCR, each pair of SCRs being constructed as an integral unit; and
said cooling means comprising a metal cooling plate coupled with a sealed liquid flow circuit and being in thermal conductive contact with the pair of SCRs, said first liquid coolant being circulated through said cooling plate for cooling said SCRs.

28. The chiller system of claim 18 wherein said AC switch comprises a different pair of SCRs for each phase of said polyphase source, the SCR of each SCR pair being electrically connected in parallel with an anode of one SCR being connected to a cathode of the other SCR, each pair of SCRs being constructed as an integral module, the two SCRs of each said module being first and second disc type semiconductor devices, said first and second semiconductor devices each having opposing pole faces; and
said module comprising a liquid cooled heat sink in thermal contact with said semiconductor devices to receive heat generated within said first and second semiconductor devices during device operation, said liquid cooled heat sink forming a part of the liquid coolant flow circuit of said cooling means, and a solid heat sink in thermal contact with said semiconductor devices to receive heat within said first and second semiconductor devices during device operation, said liquid cooled heat sink and said solid heat sink having respective first and second predetermined heat capacities to maintain a junction temperature in each said first and second semiconductor device at or below a predetermined maximum junction temperature during predetermined transient and steady state periods of device operation.

* * * * *

UNITED STATES PATENT AND TRADEMARK OFFICE
CERTIFICATE OF CORRECTION

PATENT NO. : 4,895,005

DATED : January 23, 1990

INVENTOR(S) : NORBECK ET AL.

It is certified that error appears in the above-identified patent and that said Letters Patent is hereby corrected as shown below:

In the drawings, sheets 2-7 containing Figs. 2-6, 7a, 7b and 8 should be added as shown on the attached pages.

Signed and Sealed this

Twenty-seventh Day of October, 1992

Attest:

DOUGLAS B. COMER

Attesting Officer

Acting Commissioner of Patents and Trademarks

UNITED STATES PATENT AND TRADEMARK OFFICE
CERTIFICATE OF CORRECTION

PATENT NO. : 4,895,005

DATED : January 23, 1990

INVENTOR(S) : NORBECK ET AL.

It is certified that error appears in the above-identified patent and that said Letters Patent is hereby corrected as shown below:

In the drawings, sheets 2-7 containing Figs. 2-6, 7a, 7b and 8 should be added as shown on the attached pages.

Signed and Sealed this

Third Day of November, 1992

Attest:

DOUGLAS B. COMER

Attesting Officer

Acting Commissioner of Patents and Trademarks

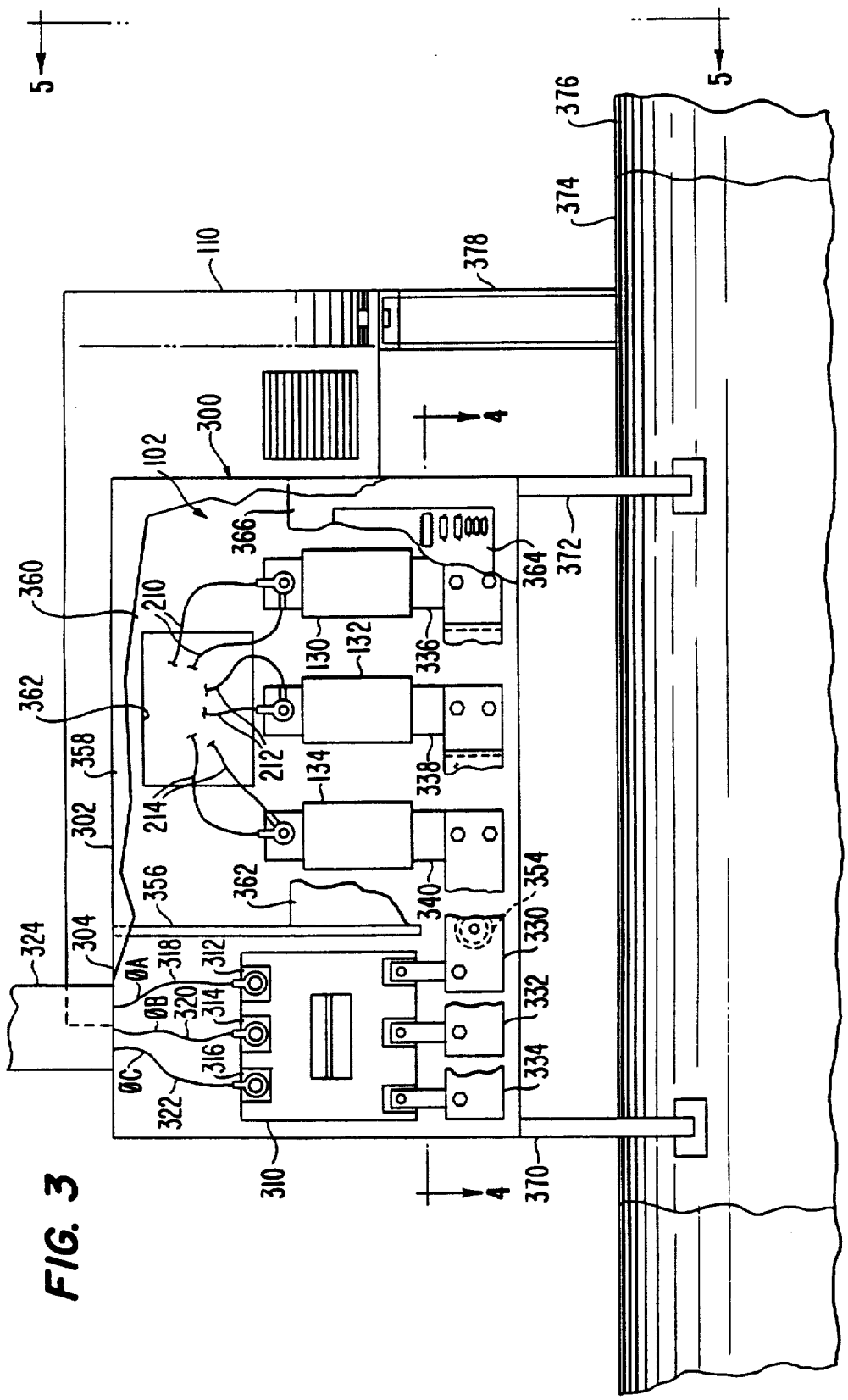

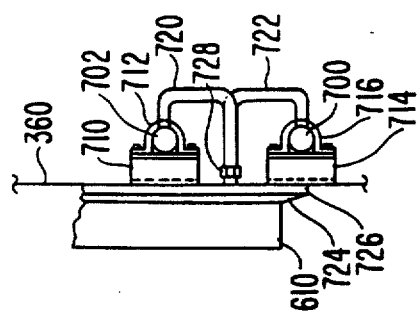
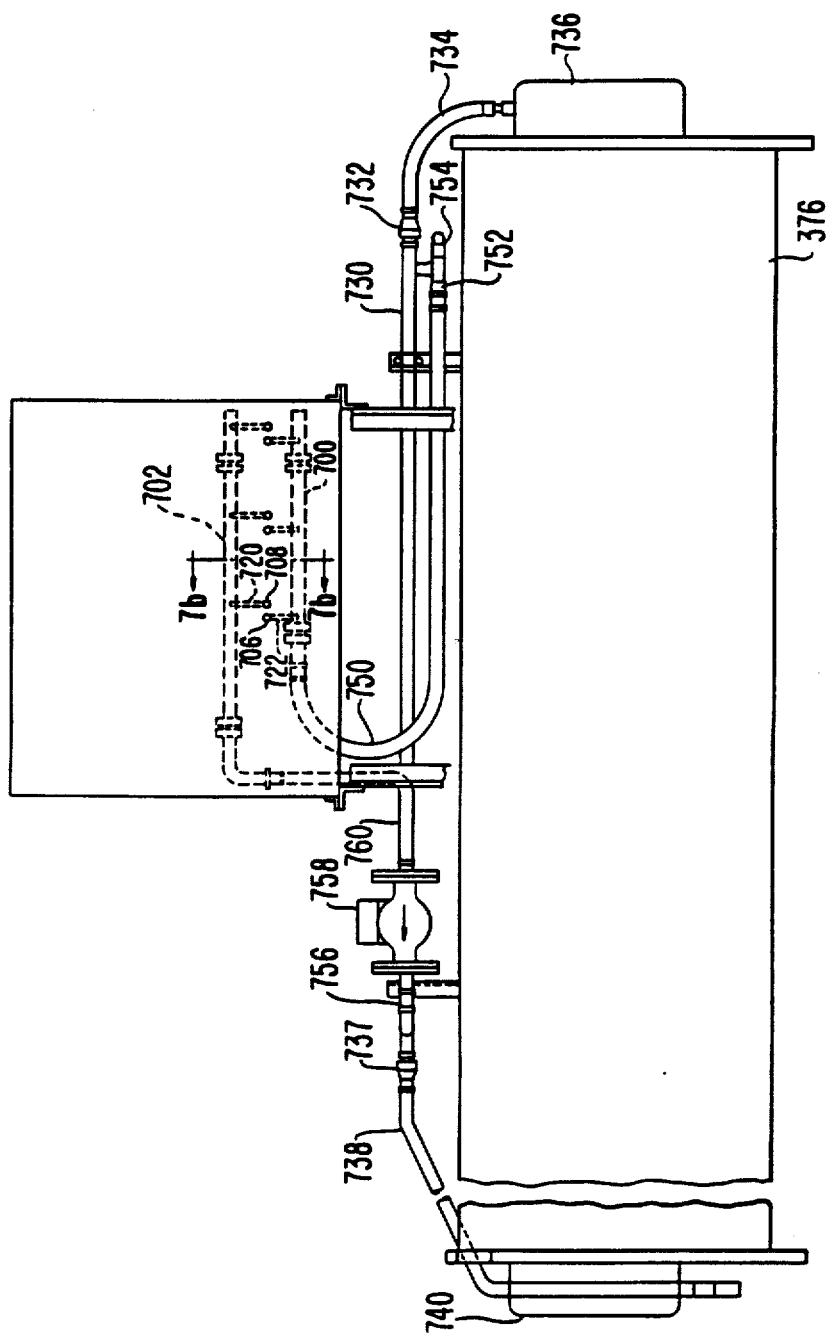
FIG. 7b
FIG. 7a